(12) United States Patent
Kobayashi

(10) Patent No.: US 7,361,454 B2
(45) Date of Patent: Apr. 22, 2008

(54) METHOD OF FORMING CONTACT HOLE AND METHOD OF MANUFACTURING SEMICONDUCTOR DEVICE

(75) Inventor: Yuji Kobayashi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 523 days.

(21) Appl. No.: 10/962,660

(22) Filed: Oct. 13, 2004

(65) Prior Publication Data

US 2005/0170294 A1 Aug. 4, 2005

(30) Foreign Application Priority Data

Oct. 15, 2003 (JP) .............................. 2003-355084

(51) Int. Cl.
*G03F 7/00* (2006.01)
(52) U.S. Cl. ...................... 430/313; 430/323; 430/330; 430/394
(58) Field of Classification Search ................ 430/323, 430/394, 313, 330
See application file for complete search history.

(56) References Cited

U.S. PATENT DOCUMENTS

| 6,486,058 | B1 * | 11/2002 | Chun ........................... 438/637 |
| 6,518,175 | B1 * | 2/2003 | Okoroanyanwu ............ 438/637 |
| 2002/0036183 | A1 * | 3/2002 | Shibata ......................... 216/44 |
| 2003/0117605 | A1 * | 6/2003 | Wu .............................. 355/67 |
| 2006/0189147 | A1 * | 8/2006 | Shiobara et al. ............. 438/725 |

FOREIGN PATENT DOCUMENTS

| JP | 2001-307993 | * 11/2001 |
| JP | 2002-57084 | 2/2002 |

OTHER PUBLICATIONS

"0.1um Level Contact Hole Pattern Formation with KrF Lithography by Resolution Enhancement Lithography Assisted by Chemical Shrink (RELACS)," T. Toyoshima, et al., Advanced Technology R&D Center, Mitsubishi Electric Corp., IEDM IEEE 1998, pp. 98-333-336.*

* cited by examiner

*Primary Examiner*—Mark F. Huff
*Assistant Examiner*—Caleen O. Sullivan
(74) *Attorney, Agent, or Firm*—Finnegan, Henderson, Farabow, Garrett & Dunner, L.L.P.

(57) ABSTRACT

A method of forming a contact hole according to an embodiment of the present invention comprises exposing a resist film formed on a semiconductor substrate to a light using a first photomask in which mask patterns are arranged two-dimensionally at a predetermined pitch; developing the resist film to form contact hole patterns corresponding to the mask patterns in the resist film; reducing an opening size of each of the contact hole patterns formed in the resist film; exposing the resist film to the light using a second photomask in which predetermined patterns are formed to set a reflow starting temperature of a first resist film area that corresponds to the predetermined patterns to be relatively higher than a reflow starting temperature of a second resist film area other than the first resist film area; and heating the semiconductor substrate at a temperature equal to or higher than the reflow starting temperature of the second resist film area and lower than the reflow starting temperature of the first resist film area to subject the second resist film area to reflow and eliminate the contact hole patterns formed in the second resist film area.

19 Claims, 8 Drawing Sheets

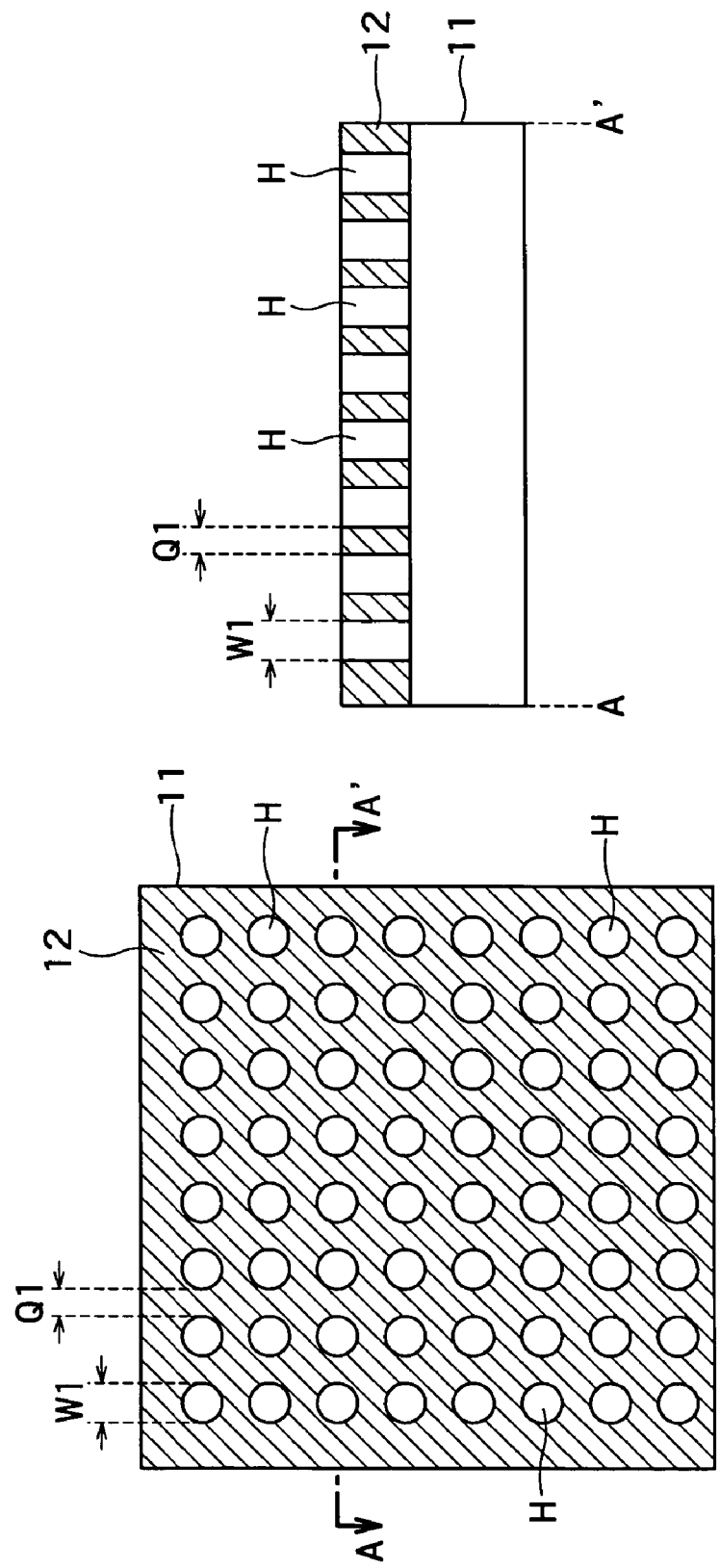

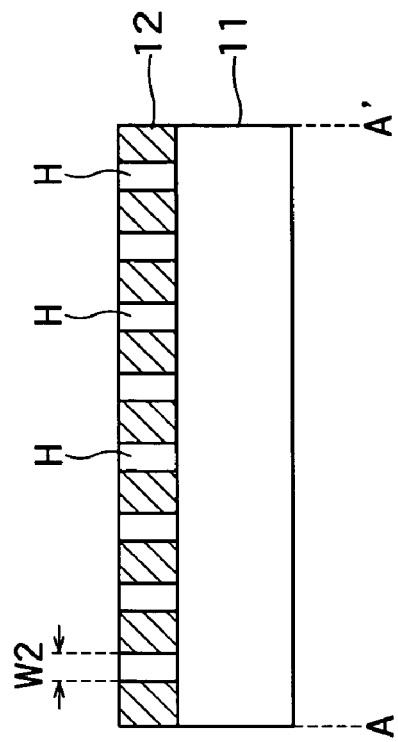
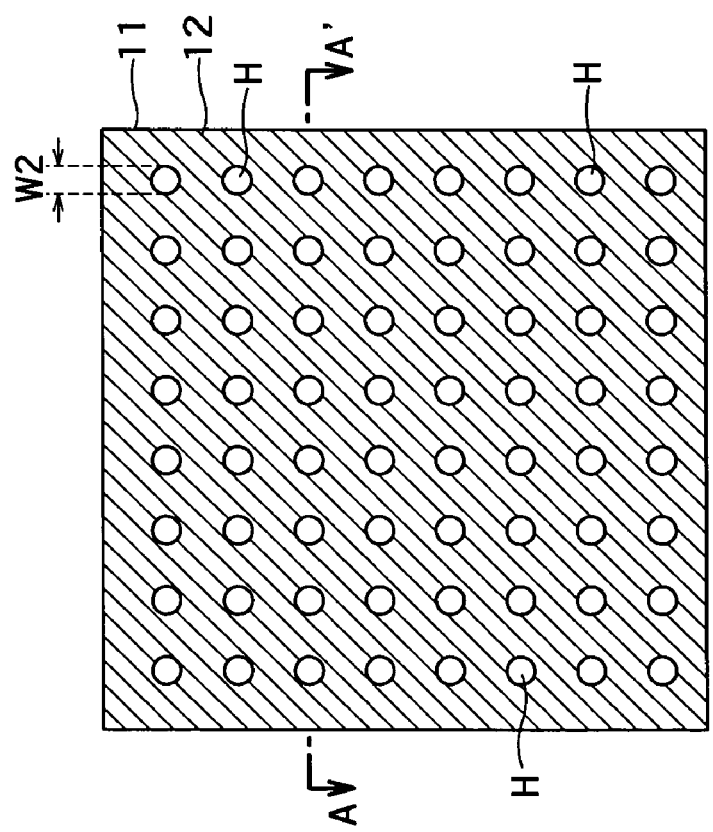
SIZE ADJUSTMENT
(BY REFLOW, REFLACS, OR SAPPHIRE)
FIG. 2A
FIG. 2B

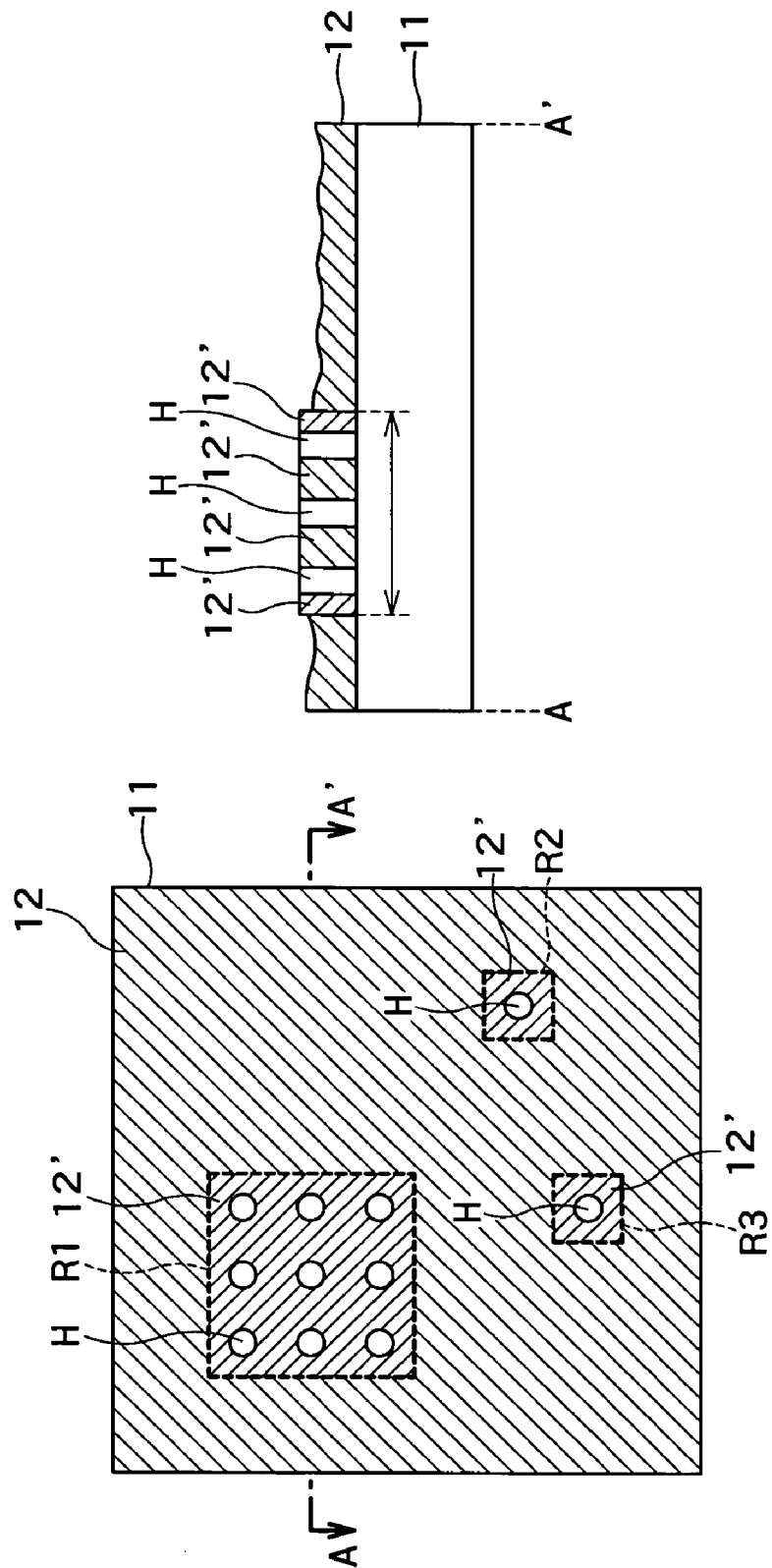

METHOD OF FORMING CONTACT HOLE AND METHOD OF MANUFACTURING SEMICONDUCTOR DEVICE

CROSS-REFERENCE TO RELATED APPLICATIONS

This application claims the benefit of priority under 35USC §119 to Japanese Patent Application No. 2003-355084 filed on Oct. 15, 2003, the entire contents of which are incorporated herein by reference.

BACKGROUND OF THE INVENTION

1. Field of the Invention

The present invention relates to a method of forming a contact hole and a method of manufacturing a semiconductor device. More specifically, the present invention relates to a method of forming a contact hole and a method of manufacturing a semiconductor device each including a step of adjusting an opening size of contact hole patterns formed in a resist film.

2. Related Background Art

In recent manufacturing of a semiconductor device a scale-down of which is advanced, not only a wavelength of an exposure light used to form a resist pattern at a lithography step is made shorter, but also a certain processing is additionally performed after forming the resist pattern, thereby adjusting a size of the resist pattern. For example, to obtain a very small contact hole, a hole diameter (a hole size) of a contact hole pattern formed in the resist film is often reduced.

Among specific examples of a process for reducing the hole diameter, a reflow process is most popular. In the reflow process, a semiconductor substrate is subjected to a heat treatment after contact hole patterns are formed in a resist film, thereby causing the resist film to slightly flow into holes and reducing the hole diameter, accordingly.

As the process for reducing the hole diameter, there is also known a so-called RELACS® (Resolution Enhancement Lithography Assisted by Chemical Shrink) process. In this RELACS® process, a water-soluble resin, which has a crosslinking reaction with an acid component in a resist film when being heated, is spin-coated on a semiconductor substrate after contact hole patterns are formed. Thereafter, a heat treatment triggers the crosslinking reaction between the water-soluble resin and the acid component in the resist film, thereby forming a film on a surface of the resist film and reducing the hole diameter, accordingly. The unnecessary water-soluble resin film is removed by a rinse solution.

Further, as the process for reducing the hole diameter, there is known a so-called SAFIER® process. In the SAFIER® process, a water-soluble resin, which shrinks when being heated, is spin-coated on a semiconductor substrate after forming contact hole patterns. The semiconductor substrate is then heated to extend a resist film in a direction parallel to a surface of the substrate by a shrink force of the water-soluble resin, thereby reducing the hole diameter.

By using one of these processes, very small contact holes which cannot be formed only by ordinary process can be formed.

Meanwhile, as one type of a photomask, there is known a photomask which has one opening pattern corresponding to one contact hole, and which has a dense part having opening patterns arranged at high density and a less-dense part having opening patterns arranged at low density. If contact hole patterns are to be formed on a resist film using such a photomask, it is conventionally, disadvantageously difficult to obtain contact hole patterns at an equal size in the dense part and the less-dense part. This conventional disadvantage will be described in more detail.

Normally, if a pattern density of the photomask is lower, a focus margin is lower. Therefore, to secure a sufficient focus margin in the less-dense part in which contact hole patterns are arranged at low density, the size of each opening pattern in the less-dense part is set larger than that in the dense part. If the size of the opening pattern in the less-dense part is set larger, the size of the contact hole pattern to be formed is, quite naturally, larger. Due to this, when the hole diameter of each contact hole pattern formed in the resist film is reduced by using the above process, it is necessary to make a variation of the hole diameter large in the less-dense part and small in the dense part so as to make the hole diameter in the dense part equal to that in the less-dense part. In other words, it is required, in the process of adjusting the hole diameter of each contact hole pattern, to change the variation of the hole diameter depending on whether the patterns are arranged at high density or low density.

Among the above-stated processes, the RELACS® process and the SAFIER® process have no variation of the hole diameter depending on whether the patterns arrangement is dense or less dense. In practice, therefore, it is difficult to use these processes for the hole formation method. Namely, neither the RELACS® process nor the SAFIER® process can solve the disadvantage that the focus margin differs between the dense part and the less-dense part of the photomask.

The reflow process, by contrast, is characterized in that the variation of the hole diameter in the less-dense part is larger than that in the dense part. Therefore, by forming the photomask while considering the difference in the variation of the hole diameter between the dense part and the less-dense part of the photomask, it is possible to form contact hole patterns at high density and contact hole patterns at a low density with an equal size. Namely, this reflow process can solve the disadvantage that the focus margin differs between the dense part and the less-dense part of the photomask.

Nevertheless, the reflow process is confronted with a disadvantage that the variation of the hole diameter is greatly influenced by accuracy of a heat process in the less-dense in comparison with the dense part. This derives from the fact that the hole size is larger in the less-dense part than in the dense part. In addition, if process conditions such as resist conditions (e.g., a resist material and a resist film thickness) and heating conditions are changed, the variation of the hole diameter is changed. It is disadvantageously necessary, therefore, to correct the photomask according to the opening pattern density.

BRIEF SUMMARY OF THE INVENTION

A method of forming a contact hole according to an embodiment of the present invention comprises exposing a resist film formed on a semiconductor substrate to a light using a first photomask in which mask patterns are arranged two-dimensionally at a predetermined pitch; developing the resist film to form contact hole patterns corresponding to the mask patterns in the resist film; reducing an opening size of each of the contact hole patterns formed in the resist film;

exposing the resist film to the light using a second photomask in which predetermined patterns are formed to set a reflow starting temperature of a first resist film area that corresponds to the predetermined patterns to be relatively higher than a reflow starting temperature of a second resist film area other than the first resist film area; and heating the semiconductor substrate at a temperature equal to or higher than the reflow starting temperature of the second resist film area and lower than the reflow starting temperature of the first resist film area to subject the second resist film area to reflow and eliminate the contact hole patterns formed in the second resist film area.

A method of manufacturing a semiconductor device according to an embodiment of the present invention comprises forming a resist film on a semiconductor substrate; exposing the resist film to a light using a first photomask in which mask patterns are arranged two-dimensionally at a predetermined pitch; developing the resist film to form contact hole patterns corresponding to the mask patterns in the resist film; reducing an opening size of each of the contact hole patterns formed in the resist film; exposing the resist film to the light using a second photomask in which predetermined patterns are formed to set a reflow starting temperature of a first resist film area that corresponds to the predetermined patterns to be relatively higher than a reflow starting temperature of a second resist film area other than the first resist film area; heating the semiconductor substrate at a temperature equal to or higher than the reflow starting temperature of the second resist film area and lower than the reflow starting temperature of the first resist film area to subject the second resist film area to reflow and eliminate the contact hole patterns formed in the second resist film area; and etching the semiconductor substrate using the first resist film area to form contact holes in the semiconductor substrate.

BRIEF DESCRIPTION OF THE DRAWINGS

FIG. 1A is a plan view of a semiconductor substrate on which a resist film, having contact hole patterns formed therein at a predetermined pitch, is formed, and FIG. 1B is a cross-sectional view along a line A-A' of FIG. 1A.

FIG. 2A and FIG. 2B are a plan view and a cross-sectional view for describing a size adjustment step (reflow step) of adjusting a size of each contact hole pattern shown in FIG. 1A.

FIG. 4A and FIG. 4B are a plan view and a cross-sectional view for describing a deletion step (heating step) of eliminating unnecessary contact hole patterns.

DETAILED DESCRIPTION OF THE INVENTION

An embodiment of the present invention will be described hereinafter with reference to the accompanying drawings.

Figure 5B:
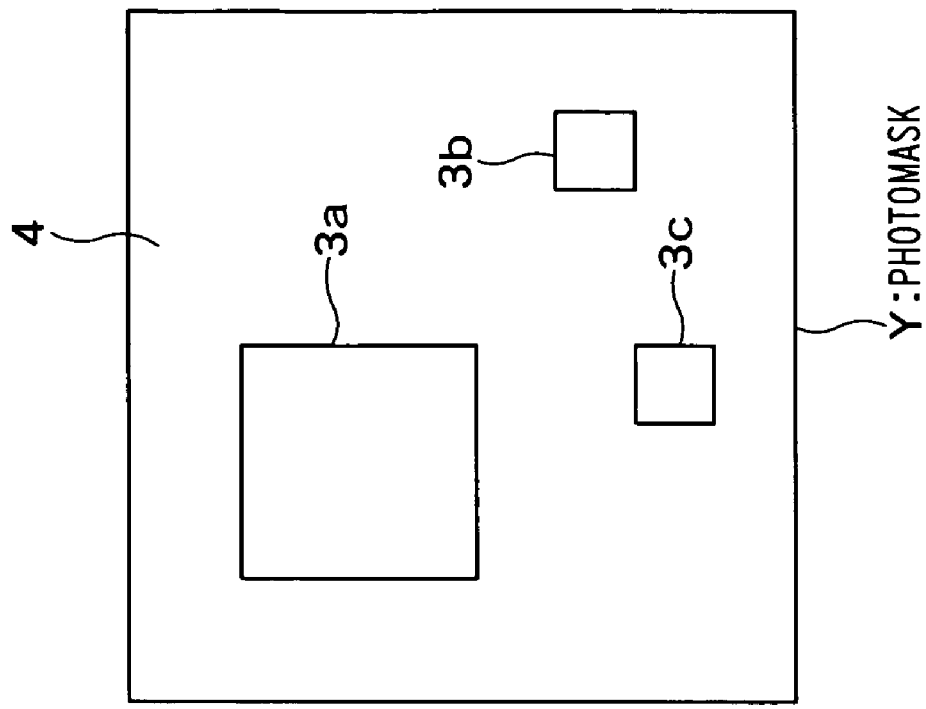
FIGS. 5A and 5B are plan views of two photomasks X and Y used in the embodiment of the present invention, respectively.
Figure 5A:
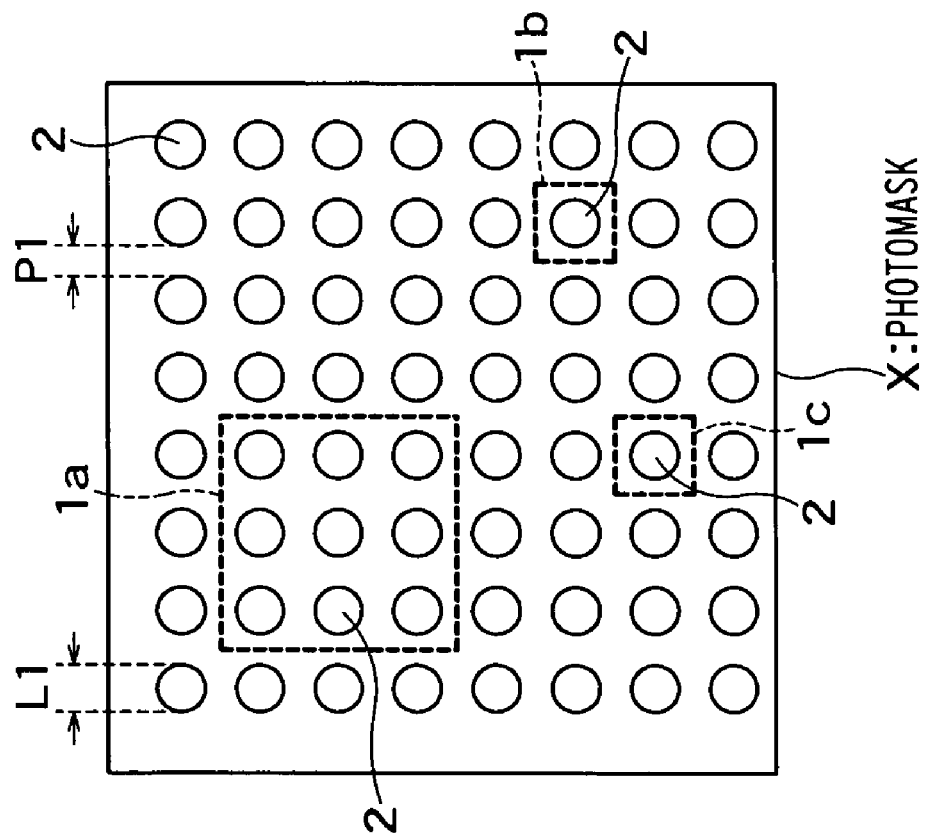

FIGS. 5A and 5B are plan views of two photomasks X and Y used in the embodiment of the present invention, respectively.

As shown in FIG. 5A, the photomask X is constituted so that mask patterns 2 each in a plane circular shape having a diameter of L1 are arranged at a pitch (an interval) P1 in a lattice fashion. The diameter L1 is, for example, 200 nm, and the pitch P1 is, for example, 300 nm. In FIG. 5A, parts surrounded by dotted lines 1a to 1c indicate mask patterns corresponding to finally formed contact holes, respectively, whereas remaining parts indicate dummy mask patterns. Specifically, the part surrounded by the dotted line 1a indicates the mask patterns arranged at high density, and the parts surrounded by the dotted lines 1b and 1c indicate the mask patterns arranged at low density, respectively.

As shown in FIG. 5B, the photomask Y includes opening patterns 3a to 3c corresponding to the parts surrounded by the dotted lines 1a to 1c shown in FIG. 5A, respectively, and a remaining shield pattern 4.

In this embodiment, using the two photomasks X and Y, contact hole patterns arranged at high density and contact hole patterns arranged at low density are formed on a single resist layer at an equal opening diameter.

FIGS. 1A and 1B, 2A and 2B, 3A and 3B, and 4A and 4B are explanatory views of contact hole formation steps according to the embodiment of the present invention.

Specifically, FIG. 1A is a plan view of a semiconductor substrate on which a resist film, having contact hole patterns formed therein at a predetermined pitch, is formed, and FIG. 1B is a cross-sectional view along a line A-A' of FIG. 1A.

FIG. 2A and FIG. 2B are a plan view and a cross-sectional view for describing a size adjustment step (reflow step) of adjusting a size of each contact hole pattern shown in FIG. 1A.

Figures 3A, 3B:
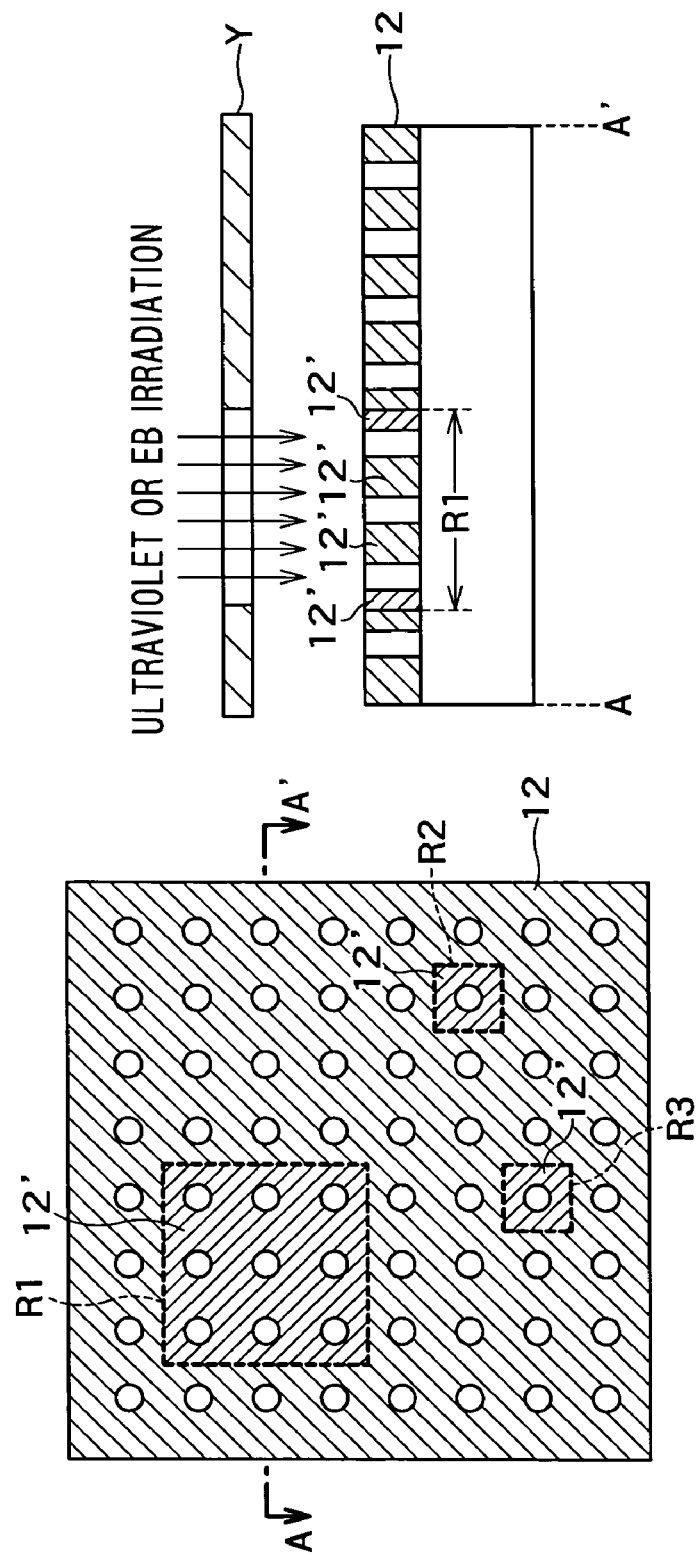
FIG. 3A and FIG. 3B are a plan view and a cross-sectional view for describing a pattern selection step (an ultraviolet exposure step) of selecting contact hole patterns to be finally left.

FIG. 3A and FIG. 3B are a plan view and a cross-sectional view for describing a pattern selection step (an ultraviolet exposure step) of selecting contact hole patterns to be finally left.

FIG. 4A and FIG. 4B are a plan view and a cross-sectional view for describing a deletion step (heating step) of eliminating unnecessary contact hole patterns.

Referring first to FIG. 1B, a KrF positive resist film 12 having a thickness of, for example, 0.4 µm is formed on a semiconductor substrate 11 having a coated antireflection film formed thereon. On the semiconductor substrate 11, elements such as transistors, resistors, and capacitors are formed in advance.

Next, a dosage (an exposure amount) of a stepper is adjusted so that a hole diameter W1 after a development step is 150 nm, and patterns are transferred to the resist film 12 using the photomask X (see FIG. 5A).

The dosage is set at, for example, 20 mJ/cm$^2$. To secure a high focus margin, it is preferable to employ a special custamaized illumination (Super High Resolution by Illumination Control), e.g., a annular illumination or a quadrupole illumination for exposure.

Conventionally, the photomask includes the dense part in which mask patterns are arranged at high density and the less-dense part in which mask patterns are arranged at low density. It is, therefore, difficult to employ the special custamaized illumination that improves only the focus margin of periodic mask patterns. The photomask used in this embodiment, by contrast, has mask patterns arranged therein periodically (see FIG. 5A). Therefore, the embodiment of the present invention can make sufficient use of the special custamaized illumination.

The semiconductor substrate 11 which has been subjected to the exposure is immersed in a tetramethylammonium hydroxide (TMAH) aqueous solution having a concentration of 2.4 weight % for 30 seconds, thereby developing the resist film 12. As a result, contact hole patterns H each having the opening diameter W1 and periodically arranged at a pitch Q1 are obtained as shown in FIG. 1A.

As shown in FIG. 2B, the semiconductor substrate 11 is heated by a single wafer processing baking unit set at, for example, 160° C. for 90 seconds, thereby subjecting the resist film 12 to reflow. As a result, the hole diameter W1 (150 nm) is reduced to, for example, a hole diameter W2 (100 nm).

Figure 6:
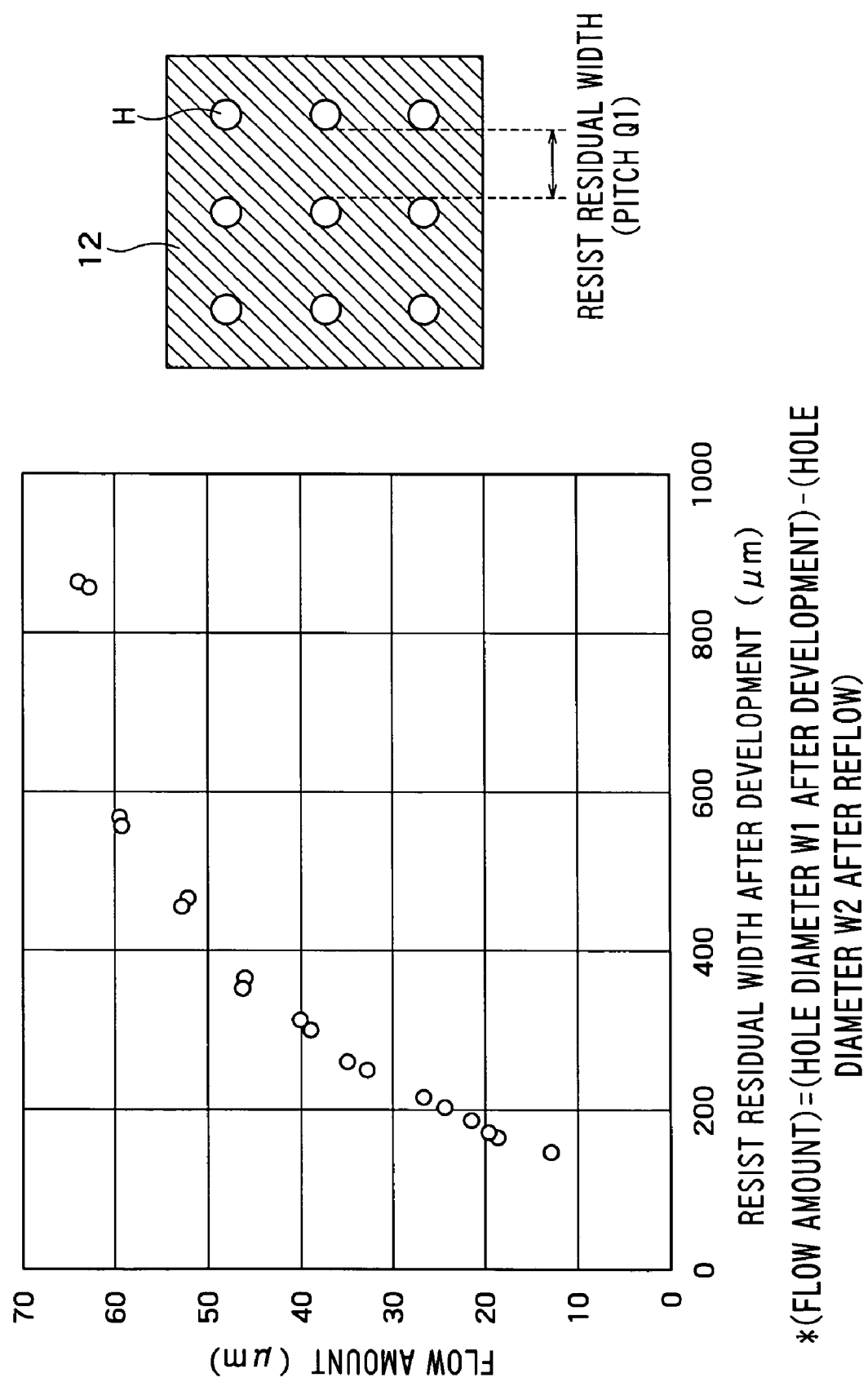
FIG. 6 is a graph which shows a relationship between the contact hole pattern arrangement pitch after the development step and a flow amount by a reflow step.

FIG. 6 is a graph which shows a relationship between the contact hole pattern H arrangement pitch Q1 (resist film residual width) after the development step and a flow amount after the reflow step ((hole diameter W1 after development)–(hole diameter W2 after reflow)). This graph is created based on a result of an original experiment conducted by the inventor of the present invention.

As can be seen from FIG. 6, if the contact hole pattern H arrangement pitch (resist film residual width) Q1 after the development step is, for example, 200 nm, the flow amount is about 25 nm. Therefore, in order to set the hole diameter W2 after the reflow step at, for example, 100 nm, the hole diameter W1 after the development step may be set at 125 (=25+100) nm under the same process conditions.

In this embodiment, the hole diameter is reduced by the reflow process. Alternatively, the hole diameter may be reduced by the other process such as the RELACS® process or the SAFIER® process. The RELACS® process and the SAFIER® process will now be described with reference to FIGS. 7A to 7D and 8A to 8D, respectively.

FIGS. 7A to 7D are cross-sectional views for describing the RELACS® process.

Figure 7A:
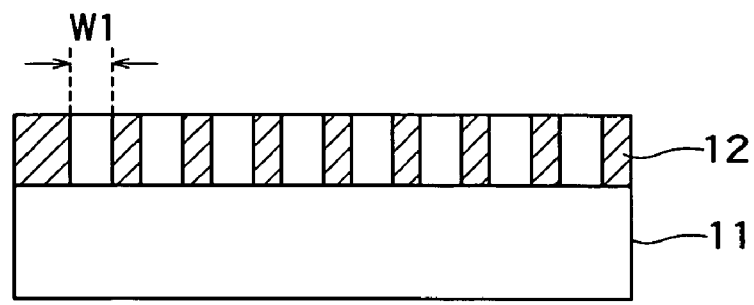
FIGS. 7A to 7D are cross-sectional views for describing a RELACS® process.
Figure 7B:
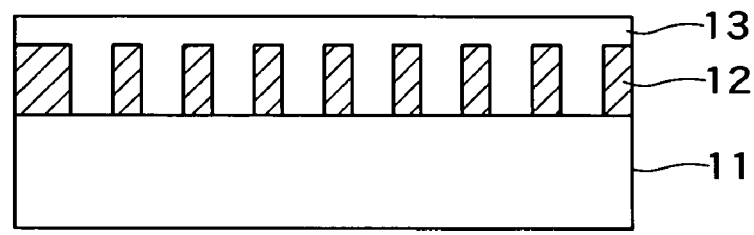
Figure 7C:
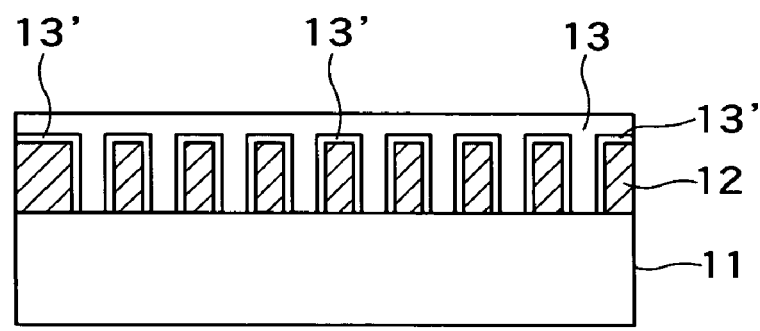
Figure 7D:
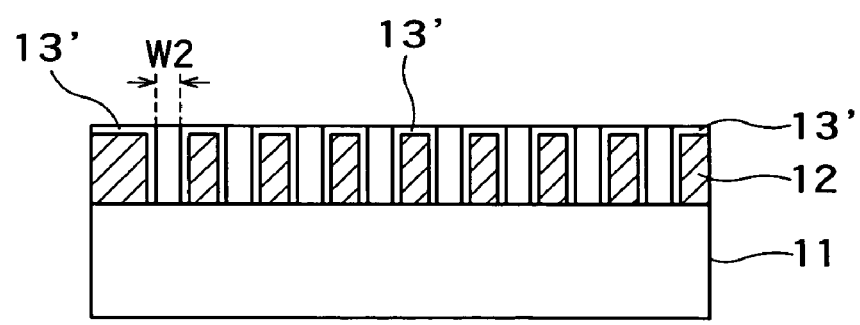

In the RELACS® process, a water-soluble resin 13, which has a crosslinking reaction with an acid component in the resist film 12 when being heated, is coated on the semiconductor substrate 11 after the development step shown in FIG. 7A (corresponding to the semiconductor substrate 11 shown in FIG. 1B) by, for example, spin coating as shown in FIG. 7B. Next, as shown in FIG. 7C, the semiconductor substrate is subjected to a heat treatment to trigger the crosslinking reaction between the water-soluble resin 13 and the acid component in the resist film 12, thereby forming a film 13'. As shown in FIG. 7D, the unnecessary water-soluble resin 13 is removed. As a result, contact hole patterns each having the hole diameter reduced from W1 to W2 are obtained.

FIGS. 8A to 8D are cross-sectional views for describing the SAFIER® process.

Figure 8A:
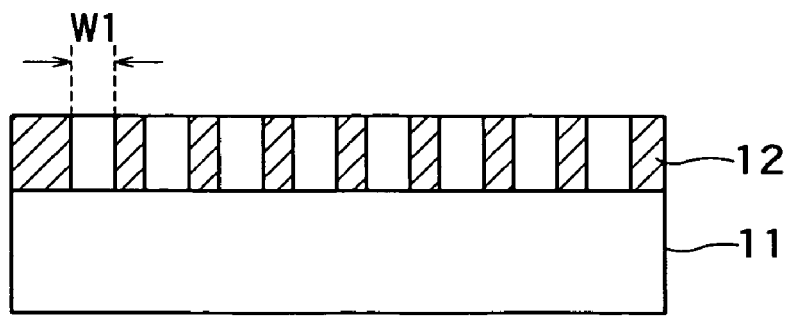
FIGS. 8A to 8D are cross-sectional views for describing a SAFIER® process.
Figure 8B:
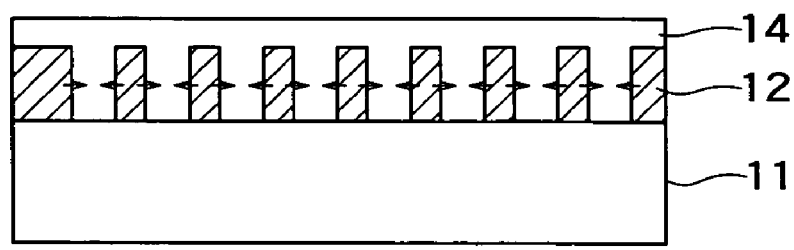
Figure 8C:
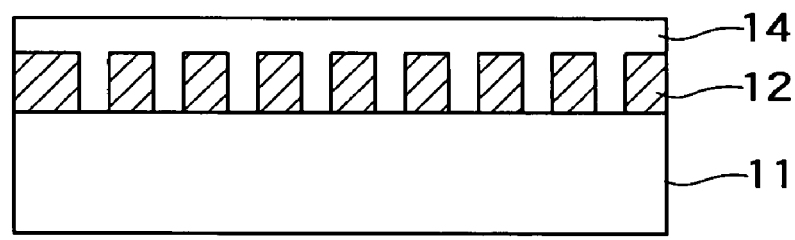
Figure 8D:
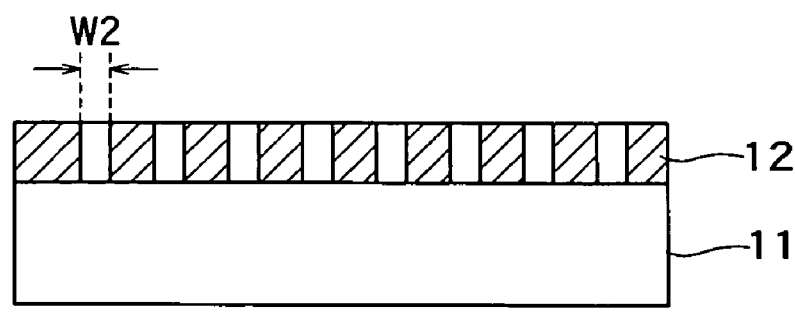

In the SAFIER® process, a water-soluble resin 14, which shrinks when being heated, is coated on the semiconductor substrate 11 after the development step shown in FIG. 8A by, for example, the spin coating as shown in FIG. 8B. Next, the semiconductor substrate 11 is subjected to a heat treatment to extend the resist film 12 in a direction parallel to a surface of the substrate 11 using a shrink force of the water-soluble resin 14 as indicated by arrows shown in FIG. 8B, thereby producing a state shown in FIG. 8C. As shown in FIG. 8D, the unnecessary water-soluble resin 14 is then removed. As a result, contact hole patterns each having the hole diameter reduced from W1 to W2 are obtained.

Referring back to FIG. 3B, using the photomask Y shown in FIG. 5B, patterns are transferred to the resist film 12, which has been subjected to the reflow step, at the exposure amount of 120 mJ/cm$^2$ (by ultraviolet exposure or electron beam exposure), thereby forming a resist film 12'. This resist film 12' is higher in reflow starting temperature than the resist film 12 to which no patterns are transferred.

Namely, in the resist film 12' in regions R1 to R3 (see FIG. 3A) which are irradiated with a sufficient light through the openings 3a to 3c of the photomask Y, respectively, resin molecules are transformed to macromolecules. Due to this, as compared with the resist film 12 which is not irradiated with the light, the resist film 12' has a high reflow starting temperature.

Next, as shown in FIG. 4B, the semiconductor substrate 11 is heated by the single wafer processing baking unit set at, for example, 165° C. for 90 seconds.

The reflow starting temperature of the resist film 12' irradiated with the light through the openings 3a to 3c of the photomask Y is sufficiently higher than the heating temperature of 165° C. Therefore, the resist film 12' is not fluidized, so that hole diameters of the contact hole patterns formed in the resist film 12' are not changed. That is, the contact hole patterns H equal in diameter are obtained in the respective regions R1, R2, and R3 of the resist film 12'.

On the other hand, the reflow starting temperature of the resist film 12, which is not irradiated with the light at the exposure step due to the presence of the shield pattern 4 of the photomask Y, is sufficiently lower than the heating temperature. Therefore, the resist film 12 is fluidized enough, so that the contact hole patterns (dummy contact hole patterns) in the resist film 12 are eliminated.

Thereafter, as shown in FIG. 4B, the semiconductor substrate 11 is subjected to reactive ion etching (RIE) or the like using the resist film 12', thereby forming contact holes (not shown) in the semiconductor substrate 11.

In this embodiment, as shown in FIG. 5A, the dummy mask patterns are arranged between the regions surrounded by the dotted lines 1a to 1c, respectively so that the mask patterns are arranged into a lattice fashion. Alternatively, the dummy mask patterns may be arranged only in minimum regions. For example, the dummy mask patterns may be arranged only in peripheral portions of the regions surrounded by the dotted lines 1b and 1c, respectively.

In this embodiment, as shown in FIG. 5A, the mask patterns are arranged in the lattice fashion. Alternatively, the mask patterns may be arranged by closest packing arrangement (for packing three patterns that constituting an equilateral triangle most closely).

In this embodiment, as shown in FIG. 5A, the mask patterns are plane circular. However, the present invention is not limited to this shape.

As described so far, according to the embodiment of the present invention, the contact hole patterns arranged at the predetermined pitch are formed in the resist film, the reflow starting temperature of the resist film in which the unnecessary contact hole patterns are formed is set relatively low, and then the resist film is subjected to the reflow. Therefore, the contact hole patterns arranged at various densities can be easily formed at the equal size and, therefore, the contact holes at an equal size can be easily formed.

Further, according to the embodiment of the present invention, the photomask in which the mask patterns equal in size are arranged at the equal pitch is used. Therefore, differently from the conventional techniques, it is unnecessary to correct the photomask in consideration of the difference in focus margin depending on whether the mask patterns are arranged at high density or low density. In other words, the focus margin can be easily secured.

Moreover, according to the embodiment of the present invention, it is unnecessary to set the sizes of the mask patterns for forming the low-density contact holes to be large, differently from the conventional techniques. Therefore, the present invention is free from the conventional disadvantage that the flow amount greatly fluctuates depending on the accuracy of the heat treatment at the size adjustment step.

What is claimed is:

1. A method of forming a contact hole, comprising:
    exposing a resist film formed on a semiconductor substrate to a light using a first photomask in which mask patterns are arranged two-dimensionally at a predetermined pitch;
    developing the resist film to form contact hole patterns corresponding to the mask patterns in the resist film;
    reducing an opening size of each of the contact hole patterns formed in the resist film;
    exposing the resist film to the light using a second photomask in which predetermined patterns are formed to set a reflow starting temperature of a first resist film area that corresponds to the predetermined patterns to be relatively higher than a reflow starting temperature of a second resist film area other than the first resist film area; and
    heating the semiconductor substrate at a temperature equal to or higher than the reflow starting temperature of the second resist film area and lower than the reflow starting temperature of the first resist film area to subject the second resist film area to reflow and eliminate the contact hole patterns formed in the second resist film area.

2. A method of forming a contact hole according to claim 1, comprising, after eliminating the contact hole patterns, etching the semiconductor substrate using the first resist film area to form contact holes in the semiconductor substrate.

3. The method of forming a contact hole according to claim 1, wherein exposure of the resist film using the first photomask is performed using a special customized illumination.

4. The method of forming a contact hole according to claim 1, wherein the predetermined patterns on the second photomask are openings, and exposure of the resist film using the second photomask is performed using an ultraviolet ray.

5. The method of forming a contact hole according to claim 1, wherein the predetermined patterns on the second photomask are openings, and exposure of the resist film using the second photomask is performed using an electron beam.

6. The method of forming a contact hole according to claim 1, comprising, after forming the contact hole patterns, subjecting the resist film to the reflow by the heat treatment to reduce the opening size of the each contact hole pattern.

7. The method of forming a contact hole according to claim 1, comprising:
    coating a water-soluble resin, which has a crosslinking reaction with an acid component in the resist film when being heated, on the semiconductor substrate;
    subjecting the semiconductor substrate to the heat treatment to form a film based on the crosslinking reaction on a surface of the resist film;
    removing unnecessary parts of the water-soluble resin which do not have the crosslinking reaction with the acid component; and
    thereby reducing the opening size of the each contact hole pattern.

8. The method of forming a contact hole according to claim 1, comprising:
    coating a water-soluble resin, which shrinks when being heated, on the semiconductor substrate;
    subjecting the semiconductor substrate to the heat treatment to extend the resist film in a direction parallel to a substrate surface by a shrink force of the water-soluble resin;
    removing the water-soluble resin; and
    thereby reducing the opening size of the each contact hole pattern.

9. The method of forming a contact hole according to claim 1, wherein a photomask, in which the mask patterns are arranged at the predetermined pitch in each of a first direction and a second direction perpendicular to the first direction, is used as the first photomask.

10. The method of forming a contact hole according to claim 1, wherein a photomask in which each of the mask patterns is plane circular is used as the first photomask.

11. A method of manufacturing a semiconductor device, comprising:
    forming a resist film on a semiconductor substrate;
    exposing the resist film to a light using a first photomask in which mask patterns are arranged two-dimensionally at a predetermined pitch;
    developing the resist film to form contact hole patterns corresponding to the mask patterns in the resist film;
    reducing an opening size of each of the contact hole patterns formed in the resist film;
    exposing the resist film to the light using a second photomask in which predetermined patterns are formed to set a reflow starting temperature of a first resist film area that corresponds to the predetermined patterns to be relatively higher than a reflow starting temperature of a second resist film area other than the first resist film area;
    heating the semiconductor substrate at a temperature equal to or higher than the reflow starting temperature of the second resist film area and lower than the reflow starting temperature of the first resist film area to subject the second resist film area to reflow and eliminate the contact hole patterns formed in the second resist film area; and
    etching the semiconductor substrate using the first resist film area to form contact holes in the semiconductor substrate.

12. The method of manufacturing a semiconductor device according to claim 11, wherein exposure of the resist film using the first photomask is performed using a special customized illumination.

13. The method of manufacturing a semiconductor device according to claim 11, wherein the predetermined patterns on the second photomask are openings, and exposure of the resist film using the second photomask is performed using an ultraviolet ray.

14. The method of manufacturing a semiconductor device according to claim 11, wherein the predetermined patterns on the second photomask are openings, and exposure of the resist film using the second photomask is performed using an electron beam.

15. The method of manufacturing a semiconductor device according to claim 11, comprising, after forming the contact hole patterns, subjecting the resist film to the reflow by the heat treatment to reduce the opening size of the each contact hole pattern.

16. The method of manufacturing a semiconductor device according to claim 11, comprising:
- coating a water-soluble resin, which has a crosslinking reaction with an acid component in the resist film when being heated, on the semiconductor substrate;
- subjecting the semiconductor substrate to the heat treatment to form a film based on the crosslinking reaction on a surface of the resist film;
- removing unnecessary parts of the water-soluble resin which do not have the crosslinking reaction with the acid component; and
- thereby reducing the opening size of the each contact hole pattern.

17. The method of manufacturing a semiconductor device according to claim 11, comprising:
- coating a water-soluble resin, which shrinks when being heated, on the semiconductor substrate;
- subjecting the semiconductor substrate to the heat treatment to extend the resist film in a direction parallel to a substrate surface by a shrink force of the water-soluble resin;
- removing the water-soluble resin; and
- thereby reducing the opening size of the each contact hole pattern.

18. The method of manufacturing a semiconductor device according to claim 11, wherein a photomask, in which the mask patterns are arranged at the predetermined pitch in each of a first direction and a second direction perpendicular to the first direction, is used as the first photomask.

19. The method of manufacturing a semiconductor device according to claim 11, wherein a photomask in which each of the mask patterns is plane circular is used as the first photomask.

* * * * *